United States Patent
Kowkutla et al.

(10) Patent No.: US 10,050,617 B2
(45) Date of Patent: Aug. 14, 2018

(54) ON CHIP REDUNDANT SYSTEM RESET FOR OUT OF CONTEXT FUNCTIONAL SAFETY SOC

(71) Applicant: TEXAS INSTRUMENTS INCORPORATED, Dallas, TX (US)

(72) Inventors: Venkateswar Reddy Kowkutla, Allen, TX (US); Erkan Bilhan, Dallas, TX (US); Sumant Dinkar Kale, Allen, TX (US); Chunhua Hu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/387,683

(22) Filed: Dec. 22, 2016

(65) Prior Publication Data
US 2018/0183434 A1   Jun. 28, 2018

(51) Int. Cl.
*H03K 17/22* (2006.01)
*H03B 5/32* (2006.01)

(52) U.S. Cl.
CPC ............... *H03K 17/22* (2013.01); *H03B 5/32* (2013.01)

(58) Field of Classification Search
CPC .. H03K 17/22; H03K 17/223; H03K 3/02335; H03K 3/0375; H03K 3/2865; H03K 3/356008; H03B 5/32
See application file for complete search history.

(56) References Cited

U.S. PATENT DOCUMENTS 5,446,404 A  *  8/1995  Badyal ................. H03K 17/223
                                                 327/143
8,872,554 B2 * 10/2014  Balmelli .................. G06F 1/24
                                                 327/143

* cited by examiner

*Primary Examiner* — Jung Kim
(74) *Attorney, Agent, or Firm* — Kenneth Liu; Charles A. Brill; Frank D. Cimino

(57) ABSTRACT

A functional safety Power on Reset system requires implementing voltage detectors and supervisory functions in a complex SOC. These features are implemented within the SOC without external components. A plurality of voltage monitoring stages is implemented to ensure redundancy.

20 Claims, 2 Drawing Sheets

US 10,050,617 B2

ON CHIP REDUNDANT SYSTEM RESET FOR OUT OF CONTEXT FUNCTIONAL SAFETY SOC

TECHNICAL FIELD OF THE INVENTION

The technical field of this invention is reset signal generation.

BACKGROUND OF THE INVENTION

A functional safety system often requires implementing voltage detectors and supervisory functions for a complex System on a Chip (SoC) in a larger system. Implementing those functions outside of the SoC not only increases the overall system cost, it also lacks the critical features to achieve high level functional safety standard specified by ISO 2626 and IEC 61508.

SUMMARY OF THE INVENTION

In order to design a complex SoC to achieve out of context functional safety features, embedded circuitry is required to generate an internal system reset with built in redundancy. Furthermore, the SoC also needs to comprehend the impact of external reset signals to make sure the device can enter a safe state when a fault occurs.

A fully integrated method is shown for generating a Power on Reset on an SoC. Continuous voltage monitoring with integrated supervisory functions and reset sequencing is implemented, with redundant, multi stage voltage monitoring.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
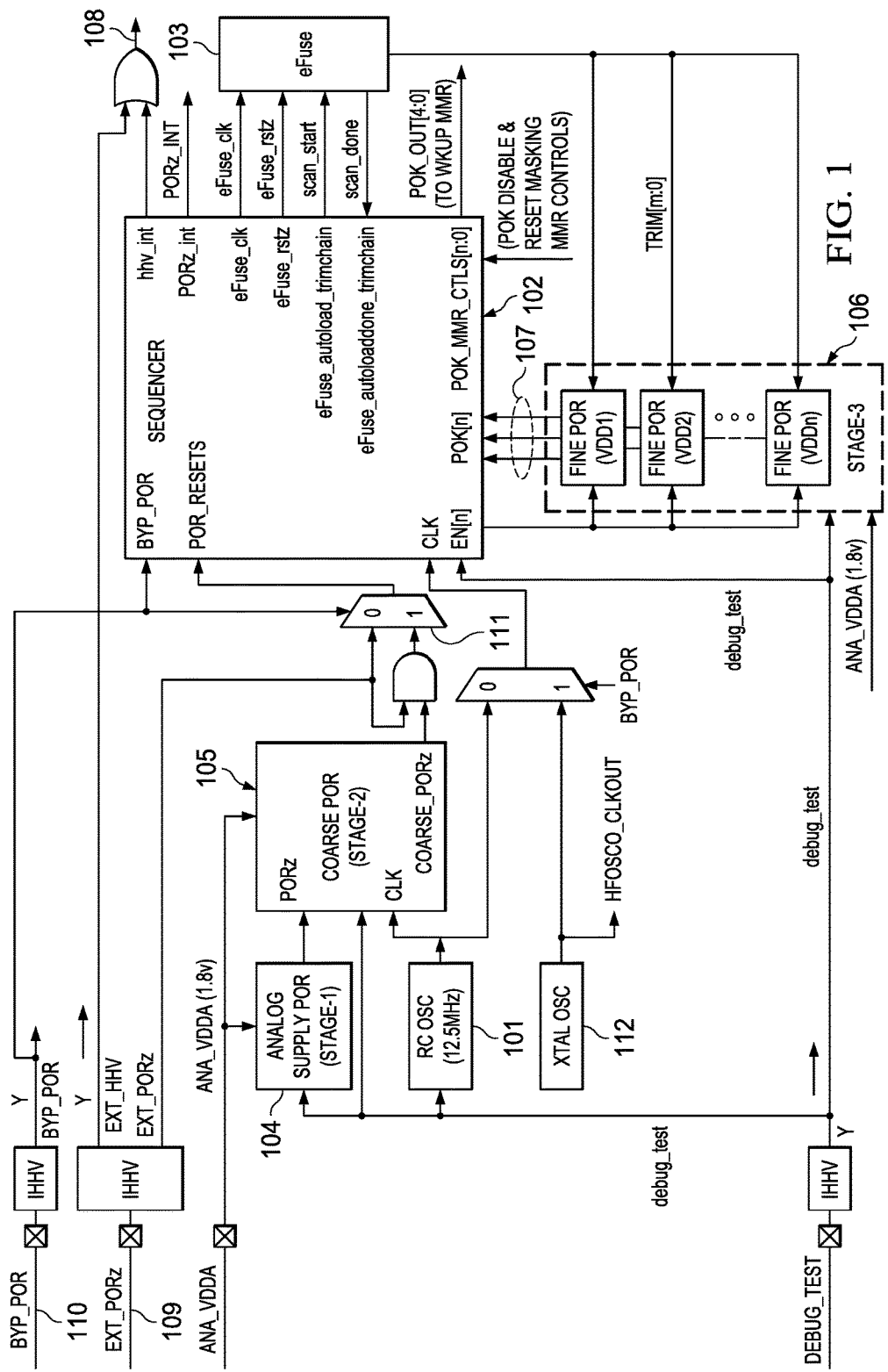
FIG. 1 shows a high level diagram of the reset circuit.

A fully integrated Power on Reset generation circuitry which can provide continuous voltage monitoring and reset sequencing is shown in FIG. 1. It incorporates control features such as redundancy and diagnostic capabilities which are critical to implement the functional safety feature.

The system includes internal oscillators, a plurality of voltage detection stages and a Power on Reset (PoR) sequencer.

The internal RC oscillator 101 and crystal oscillator 112 are used to generate the clocks required by the Power on Reset (PoR) sequencer 102 and efuse module 103. The outputs of voltage monitors 104, 105 and 106 are passed through deglitching circuits to filter out false signals such as glitches and noise from the analog sensors.

The first stage voltage detection circuit 104 is an analog supply level detector—this is to ensure that the voltage has reached a threshold level at which analog circuits can safely and reliably operate. The second stage voltage detection circuit 105 is a coarse level detector on analog voltage rails and some critical digital voltage rails, which are required for fine tuning analog sensors for process and temperature variations. The third stage voltage detection circuit 106 is a plurality of more accurate level detectors, which ensures that all voltage rails are operating within specified limits. The circuits implemented in the first stage 104 and second stage 105 do not require any trim values to fine tune the analog circuits for process and temperature variation compensations. The first stage voltage detection circuit 104 controls the reset to the second stage voltage detection circuit 105, and second stage controls the reset to the third stage voltage detection circuit 106. Final master reset signal 108 to the SoC will be a combined version of resets from all 3 stages. This ensures that the device will always receive a reset even if one of the stages is defective therefore providing the required redundancy needed for safety critical applications.

Once the voltage levels are valid, the second stage voltage detection circuit 105 releases reset to only a small portion of the device which enables the device to initiate the efuse scanning. The efuse block 103 contain analog trim values for the voltage detection circuits implemented in the third stage voltage detection circuit 106 for accurate voltage level monitoring. The third stage holds the reset to the designated voltage domains until it detects proper voltage levels on the rails.

After the efuse scanning in efuse block 103 is complete, the Power on Reset (PoR) sequencer 102 applies the trim values read out from the efuse block 103 to the analog circuits for the voltage monitors in the third stage voltage detection circuit 106. The PoR sequencer 102 then enables the voltage monitors for accurate detection of voltage levels on the rails. The sequencer then waits for a power-good (POK) signal 107 response from each individual detector circuit. When all the voltage monitors indicate power good on the rails, PoR sequencer 102 waits for all IOs and clock oscillators in the device to stabilize and then de-asserts the reset signal 108 to the designated voltage domain.

Provision is made for external reset signals 109 and 110 that will override the internally generated resets when selected by selector 111.

All reset signals are properly level shifted to the destination voltage level with appropriate pull-up or pull-down functions. This is to ensure that if the source voltage dies, the reset signal is still at an appropriate level to put the destination voltage domain in the reset state.

Figure 2:
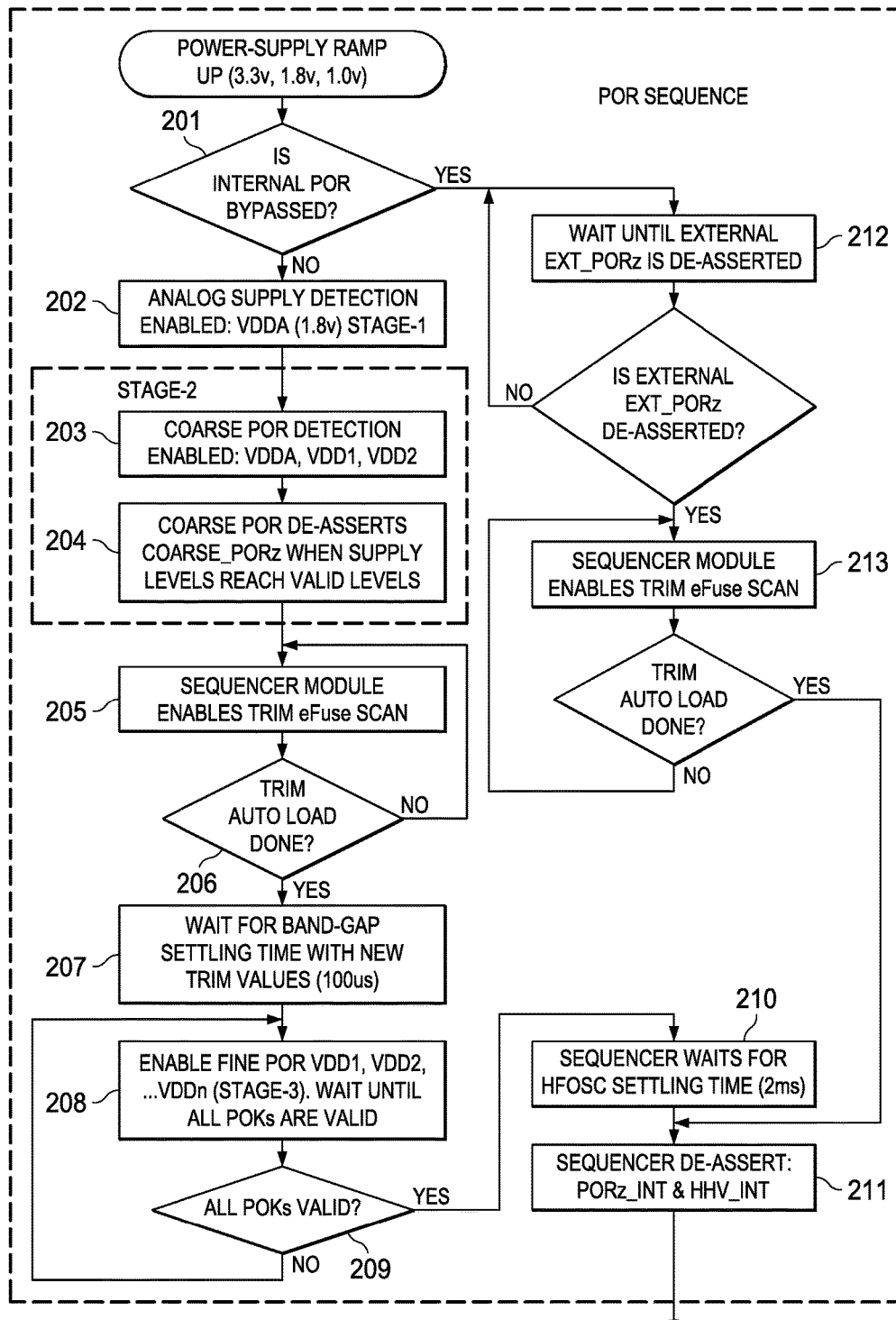
FIG. 2 is a flow chart of the reset function.

FIG. 2 shows the steps involved in the reset generation. Block 201 determines if the external PoR is asserted. If not, analog supply detection is enabled in block 202, followed by coarse PoR detection in block 203. When supply voltage levels reach valid levels, coarse PoR is deasserted in block 204. The sequencer module now enables the trim efuse scan in block 205. When completion of the scan is determined in block 206, a settling time is introduced in block 207. After the settling time, the fine corrected PoRs are enabled in block 208. When all POK (Power OK) signals are valid as determined in block 209, an oscillator settling time is introduced in block 210, followed by the deassertion of the PoR signals.

If an external PoR signal is detected in block 201, block 212 introduces a wait until the external PoR signal is deasserted. Once that is detected, the trim efuse scan is enabled in block 213. Once trim auto load is completed, flow returns to block 211.

The approach this invention implements is to break the PoR and Voltage Monitoring circuits into multiple stages. The implementation illustrated here uses 3 stages but could be extended to any number of stages. The reset outputs of all these stages are combined to generate a more definitive final master reset, which gives the required redundancy to meet safety standards. Redundancy here means if one of the reset stages gets into fault condition (non-functional state), the other stage(s) will detect the fault and generate a reset to put the device into a safe state.

What is claimed is:

1. A method to generate a power on reset (PoR) signal in a semiconductor device, the method comprising:
   performing a first comparison in a first voltage detection circuit of the semiconductor device by comparing a supply voltage to a first threshold;
   outputting a first reset signal from the first voltage detection circuit based on the first comparison;
   providing the first reset signal to a second voltage detection circuit of the semiconductor device;
   in response to the first reset signal, performing a second comparison in the second voltage detection circuit by comparing the supply voltage to a second threshold;
   outputting a second reset signal from the second voltage detection circuit in response to the second comparison;
   providing the second reset signal to a sequencing circuit of the semiconductor device;
   in response to the second reset signal, controlling, by the sequencing circuit, a trim circuit to select at least one trim value;
   applying the at least one trim value to a third voltage detection circuit of the semiconductor device;
   performing a third comparison in the third voltage detection circuit by comparing the supply voltage to a third threshold; and
   generating the PoR signal in response to the third comparison.

2. The method of claim 1, wherein the first voltage detection circuit is an analog supply level detector.

3. The method of claim 1, wherein the second comparison performed in the second voltage detection circuit is coarser than the third comparison performed in the third voltage detection circuit.

4. The method of claim 1, wherein the trim circuit comprises an electronic fuse (eFuse) circuit.

5. The method of claim 1, wherein the PoR signal is generated based additionally on the first and second reset signals.

6. The method of claim 1, further comprising:
   detecting whether an externally generated PoR signal is active; and
   overriding the generating of the PoR signal if the externally generated PoR signal is active.

7. The method of claim 1, further comprising,
   concurrent with performing the third comparison, performing at least a fourth comparison in the third voltage detection circuit by comparing another supply voltage with a fourth threshold.

8. The method of claim 7, wherein the third voltage detection circuit comprises:
   a first level detector to perform the third comparison; and
   a second level detector to perform the fourth comparison.

9. The method of claim 8, wherein the at least one trim value includes a first trim value and a second trim value, and wherein applying the at least one trim value to the third voltage detection circuit comprises:
   applying the first trim value to the first level detector; and
   applying the second trim value to the second level detector.

10. The method of claim 1, wherein the first, second, and third voltage detection circuits, the sequencing circuit, and the trim circuit are part of a reset circuit of an integrated circuit formed in the semiconductor device.

11. The method of claim 10, wherein the integrated circuit is a system-on-a-chip (SoC).

12. A semiconductor device comprising:
   a reset circuit including:
     an input to receive a supply voltage;
     a first voltage detection circuit to perform a first comparison in which the supply voltage is compared to a first threshold and to output a first reset signal based on the first comparison;
     a second voltage detection circuit to receive the first reset signal from the first voltage detection circuit and, in response to the first reset signal, to perform a second comparison in which the supply voltage is compared to a second threshold, and to output a second reset signal based on the second comparison;
     a sequencer circuit to receive the second reset signal from the second voltage detection circuit and, in response to the second reset signal, to output a scanning signal;
     a trim circuit to receive the scanning signal and to select at least one trim value in response to the scanning signal; and
     a third voltage detection circuit to receive the at least one trim value from the trim circuit, to perform a third comparison in which the supply voltage is compared to a third threshold after applying the at least one trim value, and to output a first power-good signal based on the third comparison;
     wherein the sequencer circuit is responsive to at least the first power-good signal to generate a power on reset (PoR) signal at an output of the reset circuit.

13. The semiconductor device of claim 12, wherein the first voltage detection circuit is an analog supply level detector.

14. The semiconductor device of claim 12, wherein the second comparison performed by the second voltage detection circuit is coarser than the third comparison performed by the third voltage detection circuit.

15. The semiconductor device of claim 12, wherein the trim circuit comprises an electronic fuse (eFuse) circuit.

16. The semiconductor device of claim 12, wherein the generation of the PoR signal is additionally based on the first and second reset signals.

17. The semiconductor device of claim 12, wherein the third voltage detection circuit also performs a fourth comparison in which another supply voltage is compared to a fourth threshold and outputs a second power-good signal based on the fourth comparison, and wherein the third voltage detection includes:
   a first level detector to perform the third comparison; and
   a second level detector to perform the fourth comparison.

18. The semiconductor device of claim 17, wherein the at least one trim value includes a first trim value and a second trim value, and wherein the first trim value is applied to the first level detector and the second trim value is applied to the second level detector.

19. The semiconductor device of claim 12, wherein the semiconductor device comprises a system-on-a-chip (SoC) integrated circuit.

20. The semiconductor device of claim 12, wherein the third voltage detection circuit waits for a first settling time to elapse after applying the at least one trim value before performing the third comparison.

* * * * *